(12) United States Patent
Shrinkle et al.

(10) Patent No.: US 8,525,509 B2
(45) Date of Patent: Sep. 3, 2013

(54) LOW COST SIMPLIFIED SPECTRUM ANALYZER FOR MAGNETIC HEAD/MEDIA TESTER

(75) Inventors: Lou Shrinkle, Leucadia, CA (US); Peter Crill, Encinitas, CA (US); Matthew Yee, Milpitas, CA (US); David Hu, Los Altos, CA (US)

(73) Assignee: Headway Technologies, Inc., Milpitas, CA (US)

( * ) Notice: Subject to any disclaimer, the term of this patent is extended or adjusted under 35 U.S.C. 154(b) by 466 days.

(21) Appl. No.: 11/999,169

(22) Filed: Dec. 4, 2007

(65) Prior Publication Data

US 2009/0140732 A1    Jun. 4, 2009

(51) Int. Cl.
*G01R 23/00* (2006.01)
(52) U.S. Cl.
USPC ................... 324/76.19; 324/76.29
(58) Field of Classification Search
USPC ....................................... 324/76.19
See application file for complete search history.

(56) References Cited

U.S. PATENT DOCUMENTS

| | | | | |
|---|---|---|---|---|
| 4,054,785 | A * | 10/1977 | Lehmann ................ | 708/405 |
| 4,430,611 | A | 2/1984 | Boland | |
| 4,933,641 | A * | 6/1990 | Hsiung et al. .......... | 327/351 |
| 5,038,096 | A | 8/1991 | Obie et al. | |
| 5,099,200 | A | 3/1992 | Tarantino et al. | |
| 5,818,215 | A | 10/1998 | Miyamae et al. | |
| 5,847,559 | A | 12/1998 | Takaoku et al. | |
| 6,166,533 | A | 12/2000 | Musha | |
| 6,316,928 | B1 | 11/2001 | Miyauchi | |
| 6,373,243 | B1 * | 4/2002 | Takano et al. ........... | 324/212 |
| 7,466,929 | B2 * | 12/2008 | Baney et al. ........... | 398/204 |
| 2002/0140869 | A1 * | 10/2002 | Carr et al. .............. | 348/726 |
| 2004/0012517 | A1 * | 1/2004 | Abou-Jaoude et al. ....... | 342/165 |
| 2004/0212358 | A1 * | 10/2004 | Stephen et al. ........... | 324/76.19 |
| 2006/0089115 | A1 * | 4/2006 | Goodman ................ | 455/189.1 |
| 2007/0013360 | A1 * | 1/2007 | Jenkins et al. ........... | 324/76.19 |

FOREIGN PATENT DOCUMENTS

JP    03-057975    3/1991

OTHER PUBLICATIONS

Introduction to Communication Systems, by Ferrel G. Stremler, Addison-Wesley Publishing Company, IBoston, MA, copyright 1977, pp. 146-147.
"A Simple Technique for Analog Tuning of Frequency Synthesizers," by James P. Hauser, IEEE Trans. on Instrumentation and Measurement, vol. 38, No. 6, Dec. 1989, pp. 1141-1144.

(Continued)

*Primary Examiner* — Thomas Valone
(74) *Attorney, Agent, or Firm* — Saile Ackerman LLC; Stephen B. Ackerman

(57) ABSTRACT

An electronic component tester characterizes electronic components such as magnetic head/media components measure performance parameters such as signal-to-noise ratio and overwrite evaluation. The electronic component tester has a tester process controller and a spectrum analyzer. The tester process controller generates calibration and control signals for the electronic component tester. The spectrum analyzer is in communication with electronic components such as magnetic head or media components to receive a response characterization signal resulting from a stimulus signal applied to the electronic components. The spectrum analyzer then determines a frequency spectrum of the response characterization signal. The spectrum analyzer is also in communication with the tester process controller for transferring the frequency spectrum to the tester process controller. The spectrum analyzer receives the calibration and control signals from the tester process controller for removing effects of an image frequency of the frequency spectrum and determining noise bandwidth of the frequency spectrum.

62 Claims, 8 Drawing Sheets

(56) References Cited

OTHER PUBLICATIONS

"A Spectrum Analyzer Usng a High Speed Hopping PLL Synthesizer," by M. Kumagai et al., 1994 IEEE, IMTC'94 May 1012, Hamamatsu, WEP 1-23, pp. 523-525.

"Agilent Spectrum Analysis Basics," Application Note 150, Jan. 2005, Agilent Technologies, Inc., Palo Alto CA, found www.Agilent.com, Jul. 24, 2006.

Japanese Office Action, Headway Technologies Inc., 2008-310297, Mailed—May 16, 2013.

* cited by examiner

12
LOW COST SIMPLIFIED SPECTRUM ANALYZER FOR MAGNETIC HEAD/MEDIA TESTER

BACKGROUND OF THE INVENTION

1. Field of the Invention

This invention relates generally to electronic component testing apparatus. More particularly, this invention relates to spectrum analyzers within the electronic testing apparatus for characterizing electronic components to determine a frequency spectrum of a response characterization signal received from the electronic components. Even more particularly, this invention relates to spectrum analyzers to determine the frequency spectrum of a response characterization signal from magnetic head/media components.

2. Description of Related Art

The electronic component testers for evaluating magnetic head/media components require a spectrum analyzer to measure the performance related parameters of the magnetic head/media components such as the signal-to-noise ratio (SNR) and the Overwrite ability of the magnetic head/media components.

FIG. 1 is a simplified block diagram of a superheterodyne spectrum analyzer well known in the art and is described in "Agilent Spectrum Analysis Basics", Application Note 150, January 2005, Agilent Technologies, Inc., Palo Alto, Calif., found www.Agilent.com, Jul. 24, 2006. An input signal f(t) 5 passes through an attenuator 10, then through a low-pass filter. The filtered input signal f(t) 5 is transferred through the mixer 20 where it is combined with a signal from the local oscillator (LO) 25 to form an intermediate frequency signal. Because the mixer 20 is a non-linear device, intermediate frequency signal includes not only the two original signals, but also their harmonics and the sums and differences (image signal) of the original frequencies and their harmonics.

The output of the mixer 20 is the input to the IF gain stage 30 where the mixed signal is amplified and passed to the intermediate frequency bandpass filter 40. The intermediate frequency (IF) bandpass filter 40 removes those harmonic and the sum and difference frequencies that are beyond the pass band of the bandpass filter 40. If any of the mixed signals fall within the pass band of the intermediate-frequency filter 40, it is further processed (amplified and perhaps compressed on a logarithmic scale). The output of the intermediate frequency filter 40 is transferred to the logarithmic amplifier 45 where it is logarithmically amplified. The logarithmically amplified signal is then transferred to the envelope detector 50 where it is essentially rectified. The video filter 55 filters the detected envelope signal and it is further processed for presentation on the display 60.

A ramp generator 65 creates the horizontal movement across the display 60 from left to right. The ramp signal of the ramp generator 65 also tunes the local oscillator 25 so that its frequency change is in proportion to the ramp voltage. The reference oscillator 70 provides a stable system reference timing signal for the local oscillator 25.

Since the output of a spectrum analyzer is an X-Y trace on the display 60, the trace on the display 60 presents the amplitude of the input signal f(t) 5 versus the frequency content of the input signal f(t) 5. The controls of the display 60 allow adjustment of the frequency span and the amplitude presentation for extraction of more information with regards to the frequency content and the amplitude of the component frequencies of the input signal f(t) 5.

An alternate to the superheterodyne spectrum analyzer of FIG. 1, as shown in FIG. 2, is a multi-channel spectrum analyzer as shown in *Introduction to Communication Systems*, Stremler, Addison-Wesley Publishing Co., Boston, Mass., 1977, p.: 146. The input signal f(t) 105 is applied to a bank of multiple bandpass filters 110a, 110b, ..., 110n. Each filter of the bank of multiple bandpass filters 110a, 110b, ..., 110n is constructed to cover a signal non-overlapping region of the frequency spectrum of the spectrum analyzer, such that the input signal f(t) 105 is decomposed into independent frequency bands of the frequency spectrum. The output of each of the bank of multiple bandpass filters 110a, 110b, ..., 110n is the input to one of the energy determining circuits 115a, 115b, ..., 115n. It is known in the art that as long as some voltage value of a input signal f(t) 105 is known (for example, peak or average) and the resistance across which this value is measured, the energy in the decomposed input signal f(t) 105 can be determined.

The threshold detector 130 determines the presence of the input signal f(t) 105 and activates a clocking circuit 135. The clocking circuit activates a selector switch 120 that transfers the energy signal output of each of the energy determining circuits 115a, 115b, ..., 115n to the display 125. The clocking circuit 135 also provides the synchronizing timing signal for the display to present the frequency spectrum of the input signal f(t) 105.

"A Spectrum Analyzer Using a High Speed Hopping PLL Synthesizer" Kumagai, et al., Conference Proceedings Instrumentation and Measurement Technology Conference, May 1994, pp.: 523-525, Vol. 2, describes a spectrum analyzer for an RF LSI Tester. The spectrum analyzer uses a high speed hopping synthesizer in the down-conversion unit.

"A Simple Technique for Analog Tuning of Frequency Synthesizers", Hauser, IEEE Transactions on Instrumentation and Measurement, December 1989, Vol.: 38, Issue: 6, pp.: 1141-1144 presents an analog implementation of the fractional N-phase-locked-loop variable-frequency synthesis technique. The Frequency Synthesizer implementation allows tuning over broad frequency ranges and provides a compact, low-power, local oscillator for a swept heterodyne, low-frequency, battery-operation.

U.S. Pat. No. 6,316,928 (Miyauchi) provides a spectrum analyzer that incorporates a YTO (YIG tuned oscillator) as a sweep frequency local oscillator and a YTF (YIG tuned filter) as a frequency pre-selector for an incoming signal and improves a C/N (carrier to noise) ratio.

U.S. Pat. No. 6,166,533 (Musha) describes a frequency spectrum analyzer having an improved carrier to noise ration for analyzing frequency spectrum of an input signal. The spectrum analyzer includes a frequency converters formed of a frequency mixer, a IF (intermediate frequency) filter and a local signal oscillator. The frequency mixer may employ a phase lock loop.

U.S. Pat. No. 5,847,559 (Takaoku, et al.) provides a local oscillator to be used in a spectrum analyzer that reduces dynamic spurious caused by a digital step sweep of the local oscillator. The local oscillator employs a phase lock loop.

U.S. Pat. No. 5,818,215 (Miyamae, et al.) teaches a spectrum analyzer that converts frequencies of an input signal using a local signal from a local signal generator. The spectrum analyzer then detects the frequency converted outputs, and sweeps the frequencies of the local signal generated by the local signal generator. The local signal generator includes a digital direct synthesizer, a variable frequency oscillator, and a phase locked loop for controlling the oscillation frequency of the variable frequency oscillator using the output of the digital direct synthesizer as a reference signal.

U.S. Pat. No. 5,038,096 (Obie, et al.) illustrates a spectrum analyzer for measuring the frequency spectrum of a pulsed input signal. The spectrum analyzer includes a synthesized local oscillator that includes a phase lock loop. The oscillator signal is mixed with the pulsed input signal and filtered to determine the peak voltage of a predetermined frequency component of the mixed input signal.

U.S. Pat. No. 4,430,611 (Boland) describes a frequency-spectrum analyzer with phase-lock loop for analyzing the frequency and amplitude of an input signal. The spectrum analyzer includes a voltage controlled oscillator (VCO) which is driven by a ramp generator, and a phase error detector circuit. The phase error detector circuit measures the difference in phase between the VCO and the input signal, and drives the VCO locking it in phase momentarily with the input signal. The input signal and the output of the VCO are fed into a correlator which transfers the input signal to a frequency domain, while providing an accurate absolute amplitude measurement of each frequency component of the input signal.

SUMMARY OF THE INVENTION

An object of this invention is to provide an electronic component tester that includes a spectrum analyzer for characterizing electronic components such as magnetic head/media components.

Another object of this invention is to provide an electronic component tester to measure performance parameters such as signal-to-noise ratio and overwrite evaluation.

To accomplish at least one of these objects, an electronic component tester has a tester process controller and a spectrum analyzer. The tester process controller generates calibration and control signals for the electronic component tester. The spectrum analyzer is in communication with electronic components such as magnetic head or media components to receive a response characterization signal resulting from a stimulus signal applied to the electronic components. The spectrum analyzer then determines a frequency spectrum of the response characterization signal. The spectrum analyzer is also in communication with the tester process controller for transferring the frequency spectrum to the tester process controller. The spectrum analyzer receives the calibration and control signals from the tester process controller for removing effects of an image frequency of the frequency spectrum and determines noise bandwidth of the frequency spectrum.

The spectrum analyzer is includes a low pass filter that is connected to receive the response characterization signal. The low pass filter filters harmonic frequencies above an upper bandwidth frequency from the response characterization signal. The output of the low pass filter is in communication with an up-converter circuit to receive a low pass filtered response characterization signal. The up-converter circuit converts the low pass filtered response characterization signal to an intermediate frequency signal. The up-converter circuit is in communication with the tester process controller to receive a first sweeping signal of the calibration and control signals to adjust the up-converter circuit such that the intermediate frequency signal is swept over a range of frequencies from a lower bandwidth frequency and the upper bandwidth frequency.

The output of the up-converter circuit is in communication with a first bandpass filter to receive the intermediate frequency signal for filtering to further limit the harmonic frequencies. The output of the first bandpass filter is in communication with a down converter circuit to receive a bandpass filtered intermediate frequency signal for conversion of the bandpass filtered intermediate frequency to a final output frequency signal. The down-converter is in communication with the tester process controller to receive a second sweeping signal of the calibration and control signals to adjust the down-converter circuit such that the final output frequency signal is swept over a range of frequencies from a lower bandwidth frequency and the upper bandwidth frequency.

A second bandpass filter is connected to receive the final output frequency signal from the down-converter circuit for filtering to further limit the harmonic frequencies and image signals. The output of the second bandpass filter is in communication with an energy determination circuit to receive the final output frequency signal for generating an energy content signal indicating an energy content of the final output frequency. An analog-to-digital converter is in communication with the energy determination circuit to receive the final output frequency for conversion of the energy content signal to a digital energy content signal. The analog-to-digital converter is further in communication with the tester process controller for transferring the digital energy content signal to the tester process controller. The tester process controller evaluates the energy content signal to create the frequency spectrum for characterizing the electronic components.

The up converter includes a first phase-locked loop and a first frequency mixer. The first phase-locked loop generates a first local oscillator signal. The first frequency mixer is connected to receive the receive the low pass filtered response characterization signal and in communication with the phase-locked loop for receiving the first local oscillator signal. The low pass filtered response characterization signal and the first local oscillator signal are combined to form the intermediate frequency.

The lowest frequency of the first local oscillator signal is set to be greater than a maximum frequency of the response characterization signal and the intermediate frequency. The local oscillator signal is determined by the equation:

$$f_{LO} = f_{IF} + f_{IN}$$

where:
 $f_{LO}$ is the local oscillator signal frequency.
 $f_{IF}$ is the intermediate frequency.
 $f_{IN}$ is an input frequency of the response characterization signal.

The center frequency of the first bandpass filter determined by the equation:

$$f_{BPF1} = f_{IF} + f_{BPF2}$$

where:
 $f_{BPF1}$ is the center frequency of the first bandpass filter.
 $f_{IF}$ is the intermediate frequency.
 $f_{BPF2}$ is the center frequency of the second bandpass filter.

The center frequency of the first bandpass filter determined by the equation:

$$f_{BPF1} = K \times f_{IN\_MAX}$$

where:
 K is a constant of between 1.3 and 1.5.
 $f_{in\_MAX}$ is a maximum frequency of response characterization signal.

The down converter circuit includes a second phase-locked loop and a second frequency mixer. The second phase-locked loop generates a second local oscillator signal. The second frequency mixer is connected to receive the bandpass filtered intermediate frequency signal and the second frequency mixer is in communication with the phase-locked loop for receiving the second local oscillator. The bandpass filtered intermediate frequency signal and the second local oscillator signal are combined to form the final output frequency signal.

The spectrum analyzer further includes a reference oscillator in communication with the up-converter circuit and the down-converter circuit to provide a stable reference frequency signal for the up-converter circuit and the down-converter circuit.

To calibrate a logarithmic linearity factor of the spectrum analyzer, the tester process controller injects a calibration stimulus signal into the spectrum analyzer and receives the digital energy content signal. The calibration stimulus signal is swept through a range of amplitude to determine the logarithmic linearity factor.

To calibrate a frequency flatness factor of the spectrum analyzer, the tester process controller injects the calibration stimulus signal into the spectrum analyzer and receives the digital energy content signal. The calibration stimulus signal is swept through a range of frequencies to determine the frequency flatness factor of the spectrum analyzer. The frequency flatness factor is applied to the digital energy content signal to flatten frequency response of the digital energy content signal.

To calibrate a noise bandwidth factor for the spectrum analyzer, the tester process controller injects the calibration stimulus signal and a white noise signal of known amplitude into the spectrum analyzer and receives the digital energy content signal. The calibration stimulus signal is swept through a range of amplitude frequency to calibrate the noise bandwidth factor.

DETAILED DESCRIPTION OF THE INVENTION

Magnetic head/media testers need spectrum analyzers to measure performance related parameters, such as SNR and Overwrite analysis. The magnetic head/media tester of this invention includes a low cost simplified spectrum analyzer, which is sufficiently accurate to give good data on the performance of magnetic head and media.

Figure 1:
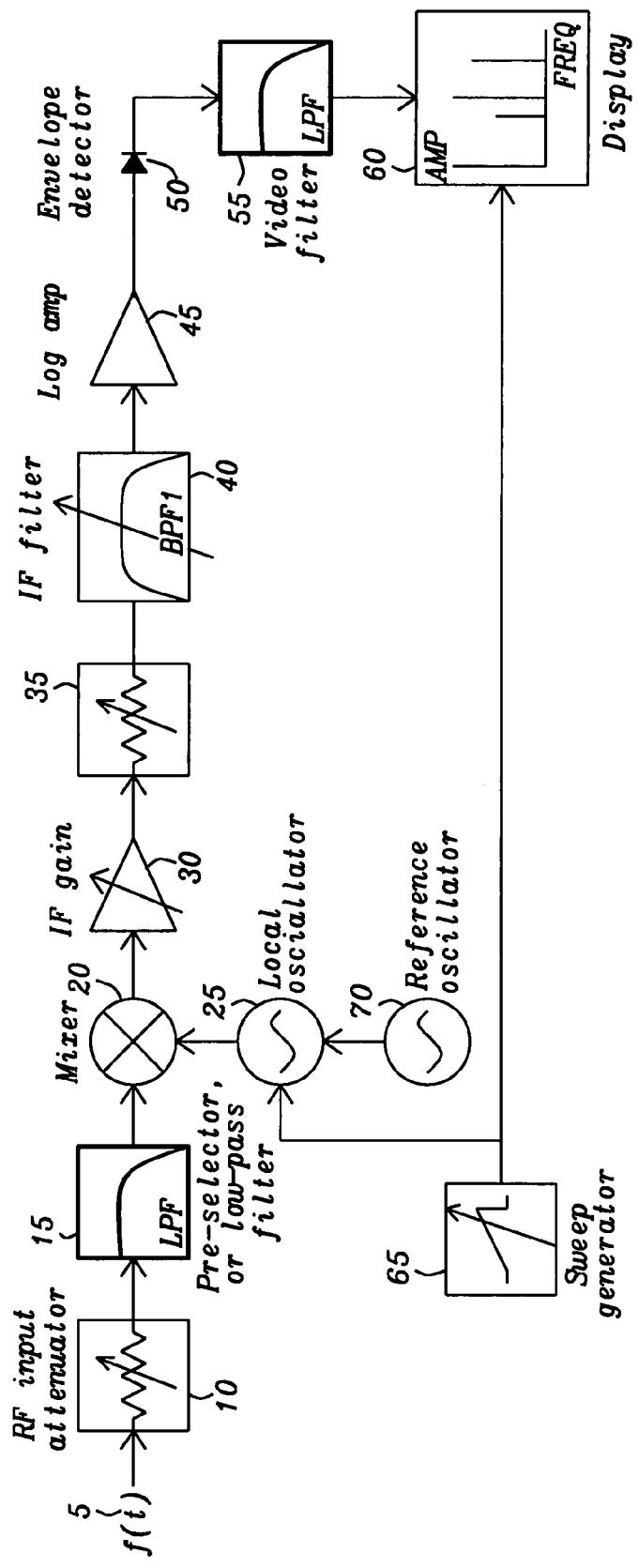
FIG. 1 is a schematic diagram of a superheterodyne spectrum analyzer of the prior art.

A typical implementation of a spectrum analyzer of the prior art as described in FIG. 1 uses an up converter with a series of down converters to eliminate the image freq create by the mixer operation. Often the spectrum analyzer will include a high speed analog-to-digital converter with digital signal processing to extract the frequency spectrum. All of the above methods are costly and unnecessarily complex for magnetic head/media testers. Typically, a disk drive has a spectrum of interest that ranges from about 1 MHz to several hundreds of MHz with a resolution bandwidth of a few hundred KHz. The magnetic head/media tester of this invention is particularly suitable for the spectral property of magnetic head/media components.

The spectrum analyzer of the magnetic head/media tester of this invention includes simple super-heterodyne receiver that includes a single up-converter circuit, down-converter circuit, filters for eliminating harmonics and mixer induced image frequencies and a logarithmic amplifier at the final stage to convert the dynamic range of the input signal to decibels. The output of the logarithmic amplifier is then the input of an analog-to-digital converter to generate a digital energy content signal indicative of the frequency spectrum of a response characterization input signal. The up-converter circuit and down-converter circuit each are formed of a mixer and a phase lock loop. The typical input frequency range is from 1 MHz to 750 MHz.

Figure 3:
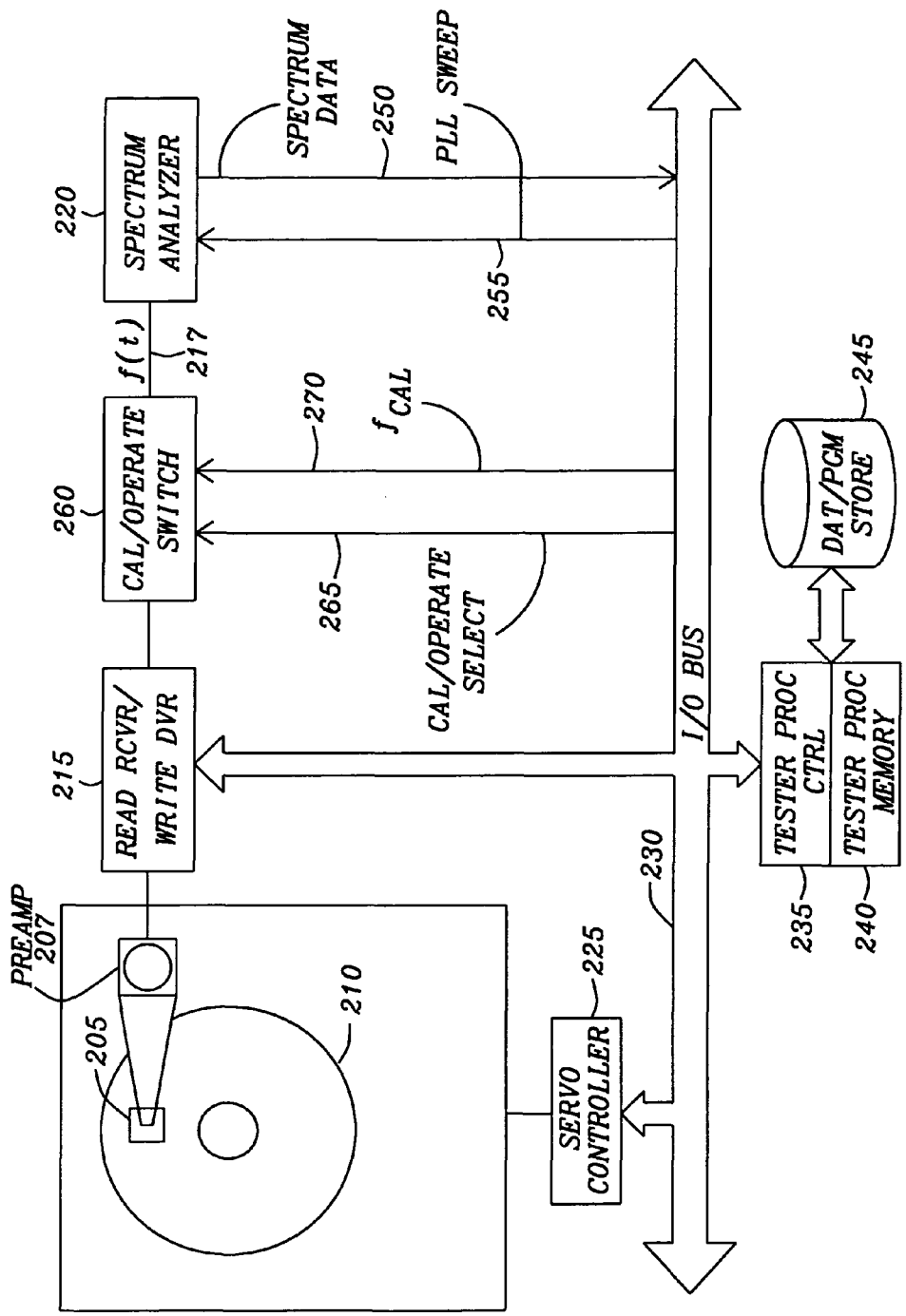
FIG. 3 is a block diagram of a magnetic head/media component tester of this invention.

Refer now to FIG. 3 for a more detailed description of the Magnetic head/media tester of this invention. A magnetic head 205 or magnetic media 210 that are the electronic components being tested are secured to a device tester fixture 200. If the device tester fixture 200 is to test a magnetic head 205, a standard magnetic media 210 is attached such that the magnetic head 205 is coupled to receive a standard testing signal. If the device tester fixture 200 is to characterize magnetic media 210, a media is placed on the device tester fixture 200 and read and written through the head to establish the characteristics of the media. The servo controller 225 receives the control signals from the tester process controller 235 to activate and control the mechanical operation of the tester fixture 200. The servo controller 225 adjusts the speed of operation of the magnetic media 210 to generate the characteristic response signal from the magnetic head 205 or magnetic media 210.

The response characteristic signals from the magnetic head 205 or magnetic media 210 are transferred to the Read Receiver/Write Driver circuit 215 provides the write signals for programming the magnetic media 210 for evaluation of the magnetic head 205 or the magnetic media 210. The Read portion of the magnetic head 205 is connected to a preamplifier 207 for initial amplification and conditioning of the response characterization signal read by the magnetic head 205. The preamplifier 207 is connected to the Read Receiver/Write Driver circuit 215 to receive the response characterization signal read by the magnetic head 205 and preamplified by the preamplifier 207. If the test is to evaluate the validity of the response characterization signal, the response characterization signal is transferred from the Read Receiver/Write Driver circuit 215 to the input/output bus 230 of the test and then to the tester process controller 235 for evaluation. If the response characterization signal is to have a characteristic frequency spectrum determined, the response characterization signal f(t) 217 is transferred through the calibration/operation switch 260 to the spectrum analyzer 220. The tester process controller 235 sets the calibrate/operate select signal line 265 to the operate mode for the transfer of the response characterization signal f(t) 217 through the calibration/operation switch 260 to the spectrum analyzer 220.

Figure 4:
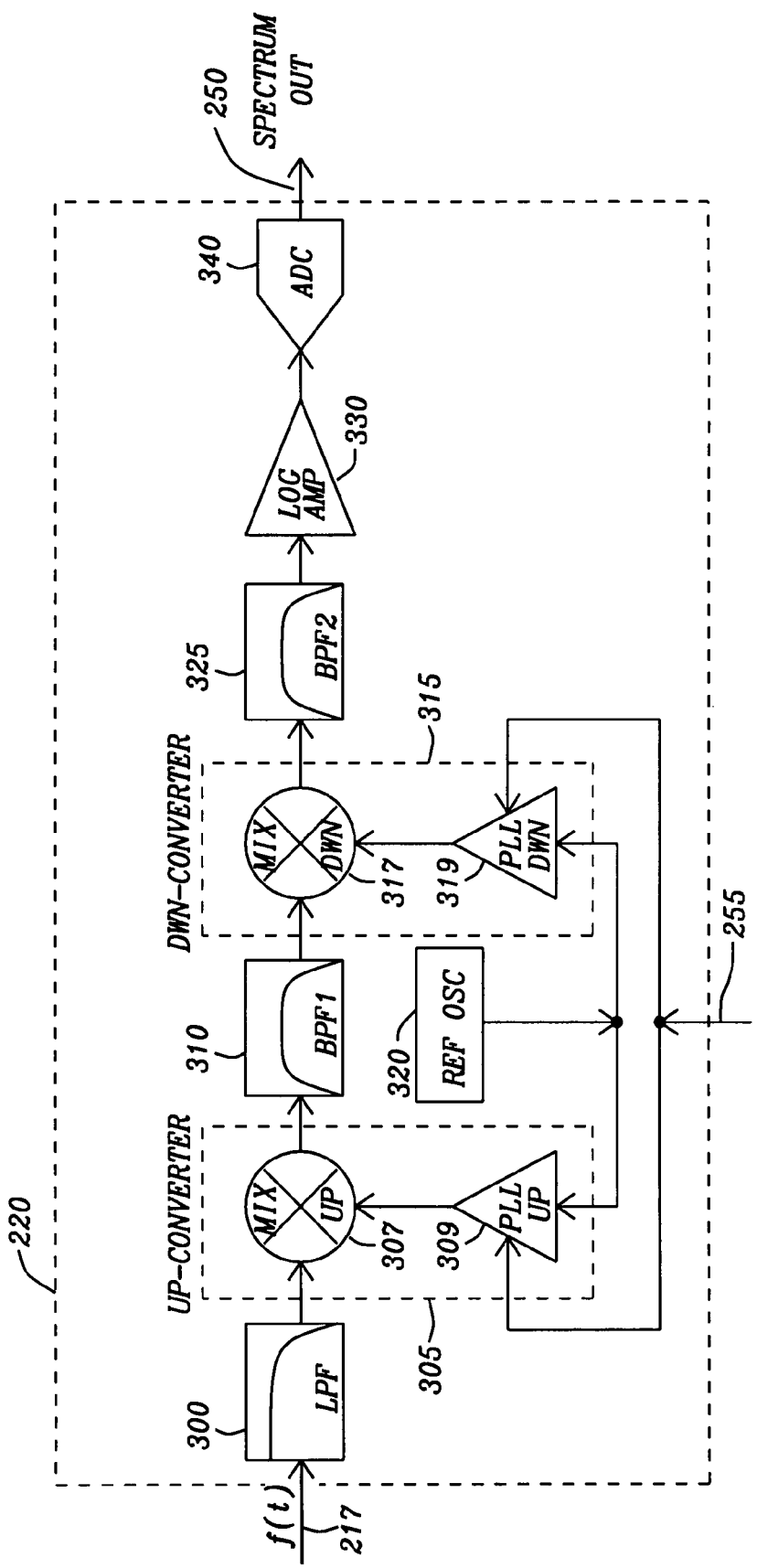
FIG. 4 is a schematic diagram of the spectrum analyzer of the magnetic head/media component tester of this invention.

Refer now to FIG. 4 for a description of the spectrum analyzer 220. The response characterization signal f(t) 217 is applied to the low pass filter 300. The low pass filter 300 is used to remove harmonics above the 750 MHz prior to the up-conversion. The typical input frequency range of the response characterization signal f(t) 217 is from 1 MHz to 750 MHz. The upper frequency corner of the low pass filter 300 is the 750 MHz. The 1 MHz low frequency corner is typically limited by the preamplifier 207 of the magnetic head 205 since the magnetic head 205 provides no useful information below the 1 MHz. The filter response characterization signal output of the low pass filter 300 is the input to the up-converter circuit 305. The up-converter circuit 305 includes the first mixer 307 and the first phase locked loop 309. The first mixer 307 receives the filtered response characterization signal output of the low pass filter 300.

The first phase locked loop 309 receives a reference clock from the reference oscillator 320. The reference oscillator 320 uses a standard crystal for the reference clock. A phase locked sweep control signal 255 is applied to program the first local oscillator signal that is generated by first phase locked loop 309.

The first local oscillator signal is the second input to the first mixer 307 and is combined with the filtered response characterization signal to create the intermediate frequency signal. The intermediate frequency signal from the first mixer 307 is the output of the up-converter circuit 305 and is applied to the input of the first bandpass filter 310. The intermediate frequency signal $f_{LO}$ from the up-converter circuit 305 is set to be greater than the maximum frequency of the response characterization signal f(t) 217.

The first bandpass filter 310 limits the filtered response characterization signal harmonics and local oscillator harmonics to below the maximum frequency of the response characterization signal f(t) 217. The center frequency of the first bandpass filter 310 is determined by the equation:

$$f_{BPF1} = K \times f_{IN\_MAX}$$

where:
K is a constant of between 1.3 and 1.5.
$f_{in\_MAX}$ is a maximum frequency of response characterization signal.

The output of the first bandpass filter 310 is the input to the down-converter circuit 315. The down-converter circuit 315 includes the second mixer 317 and the second phase-locked loop 319. The second phase-locked loop 319 receives the reference clock from the reference oscillator 320. A phase locked sweep control signal 255 is applied to program the second local oscillator signal that is generated by second phase locked loop 309.

The second local oscillator signal is the second input to the second mixer 317 and is combined with the filtered intermediate frequency signal to create the final output frequency signal. The final output frequency signal from the second mixer 317 is the output of the down-converter circuit 315 and is applied to the input of the second bandpass filter 325. The first bandpass filter 310 and the second bandpass filter 325 eliminate all the image frequencies developed by the first mixer 307 and the second mixer 317 except those image frequencies within the bandwidth of the second bandpass filter 325. As noted above, the spectrum of interest that ranges from about 1 MHz to several hundreds of MHz with a resolution bandwidth of a few hundred KHz. Thus, the bandwidth of the second bandpass filter 325 will be set to essentially the maximum resolution bandwidth of the magnetic/media. The first bandpass filter, further, is set to have a center frequency determined by the equation:

$$f_{BPF1} = f_{IF} + f_{BPF2}$$

where:
$f_{BPF1}$ is the center frequency of the first bandpass filter 307.

$f_{IF}$ is the intermediate frequency.
$f_{BPF2}$ is the center frequency of the second bandpass filter 317.

An example of typical range of frequency for the spectrum analyzer of this invention is as follows:
$f_{IN}$=1 to 750 MHz,
$f_{IF}$=950 MHz,
$f_{LO}$=952 to 1701 MHz.

An example of the bandwidth of the Low Pass filter 300 is equal to 750 MHz. The center frequency of the first bandpass filter 307 is equal to 951 MHz with a bandwidth of +/−50 MHz. The center frequency of the second bandpass filter 317 is equal to 1 MHz with a bandwidth of +/−100 KHz.

The simplified spectrum analyzer does have limitations in the rejection of image frequency. The image frequency signal, as is known in the art, is caused by ambiguity in mixing of the response characterization signal f(t) 217 and the local oscillator signal. Since conversion to the intermediate frequency signal takes place according to the relationship: $f_{IF}=|f_{IN}-f_{LO}|$, there will be exactly two frequencies generated for the intermediate frequency for a fixed setting of the local oscillator frequency.

The image frequency signal does not significantly effect typical measurements in the magnetic head/media tester of this invention. To illustrate the image frequency issue with the above mixer frequency setup. If we want to measure the spectrum of a signal at 10 MHz, The frequency of the local oscillator is set to 961 MHz. The energy at 10 MHz is up-converted in the up-converter 307 to 951 and 971 MHz. For reasons that will be clear later, the energy at 12 MHz must also be considered. The 12 MHz signal is also converted to 949 MHz and 973 MHz. These four frequency components are too close spectrally and cannot be filtered by the first bandpass filter 310. The frequency components are then mixed with the second local oscillator signal of the second phase-locked loop 319 set at 950 MHz. The results are 8 frequencies at −1 MHz, 1 MHz, 21 MHz, 23 MHz, 1899 MHz, 1901 MHz, 1921 MHz and 1923 MHz. The first bandpass filter 310 and second bandpass filter 325 will reject all except the −1 MHz and 1 MHz components of the signal. The −1 MHz is the image frequency due to the energy at 3 MHz of the original response characterization signal 217. This image frequency shows up at the output of the down-converter circuit 315 as a real signal at 1 MHz. This image frequency is not acceptable for traditional spectrum analyzer applications, but, as will be described hereinafter, the effects can be removed from the final output frequency signal.

The final output frequency signal is applied to a logarithmic amplifier 330 to convert the dynamic range of the response characterization signal f(t) 217 to decibels to determine the energy content of the response characterization signal f(t) 217. The output of the logarithmic amplifier 330 is applied to the input of the analog-to-digital converter 340 to convert the final output frequency signal to a digital energy content signal 250.

Returning to FIG. 3, the digital energy content signal 250 is applied to the input/output bus 230 for transfer to the tester process controller 235 for further evaluation. The tester process controller 235 is connected to a tester processor memory 240 and a data/program storage device 245 to retain the necessary program and data for the operation of the magnetic head/media tester of this invention.

Figure 5:
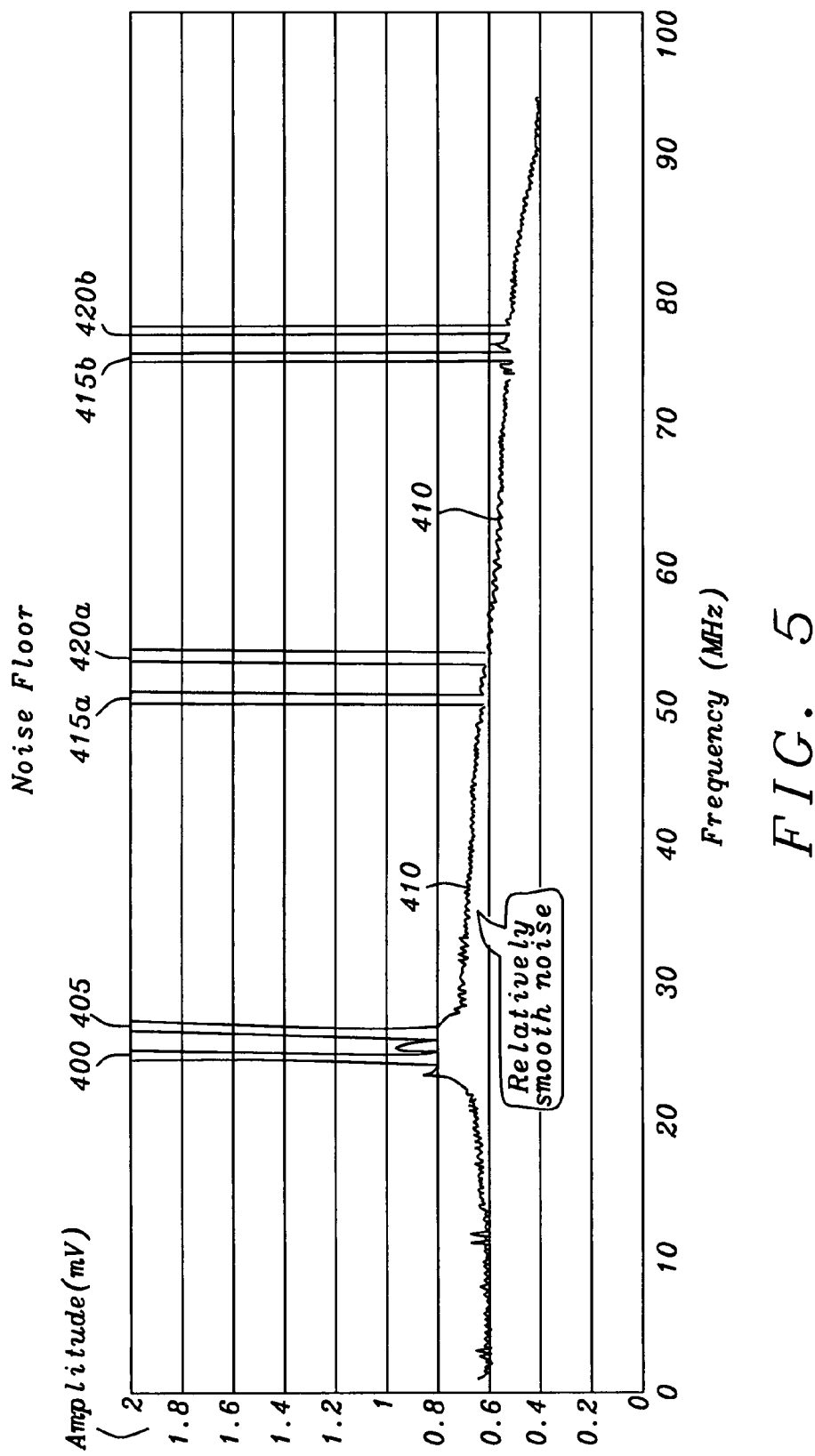
FIG. 5 is a plot of the frequency spectrum of the magnetic head/media components a determined by the magnetic head/media component tester of this invention illustrating the noise floor of the determined frequency spectrum.
Figure 6:
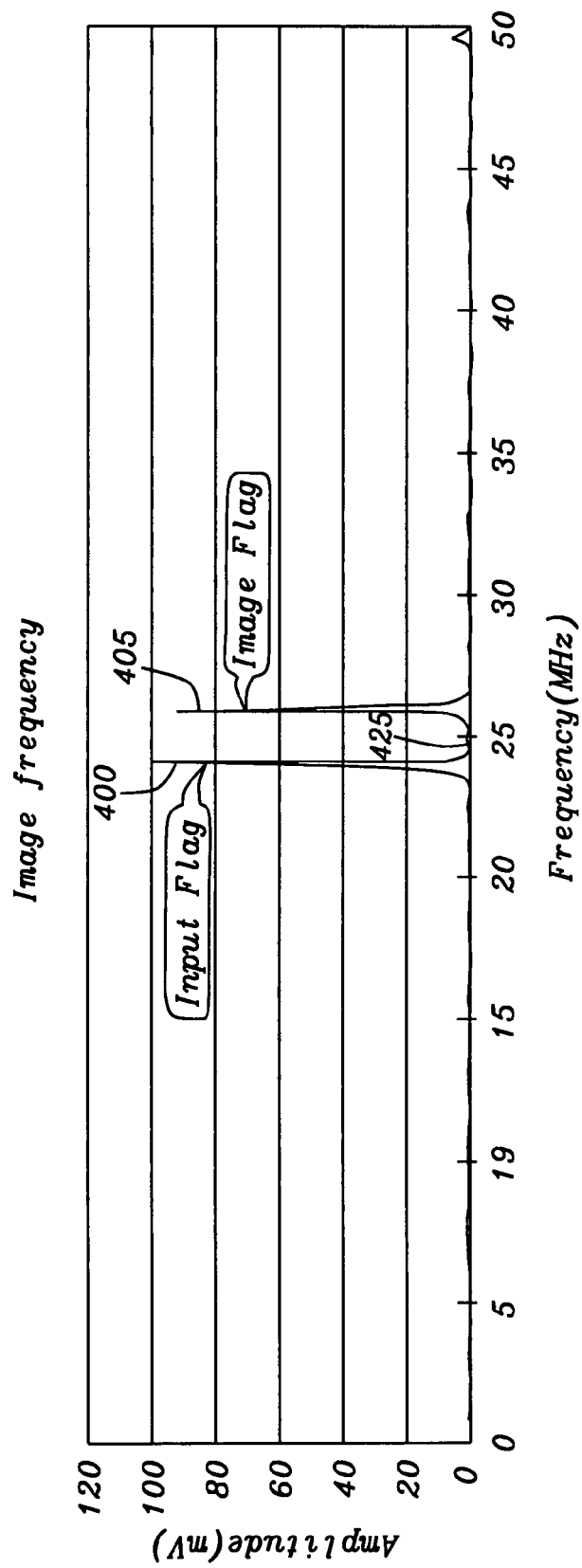
FIG. 6 is a plot of the frequency spectrum of the magnetic head/media components a determined by the magnetic head/media component tester of this invention illustrating the image frequency of the frequency spectrum.

The image frequency signal is not a significant problem for magnetic head/media testing for the following reasons. Typical testing of magnetic head/media is limited to measurements of the response characterization signal at discrete frequencies. Noise measurement is sampled at intervals of a few MHz. The response characterization signal spectral contents are well defined with few harmonics as shown in FIG. 5. The final fundamental frequency 400 and its image frequency 405 are sharply defined with a relatively smooth noise floor 410 between the harmonics 415a and 415b of the final fundamental frequency signal and the harmonics 420a and 420b of the image frequency signal. Further, as shown in FIG. 6, the noise floor 425 between the final fundamental frequency 400 and its image frequency 405 is relatively smooth and constant within a 2 MHz Bandwidth. The final fundamental frequency 400 to the noise floor 410 ratio is typically 45 dbs as shown in FIG. 5.

An example of a typical test of the magnetic head/media tester of this invention is a signal-to-noise ratio test. This test requires two types of measurements. First, the final fundamental frequency 400 is measured at its fundamental frequency. Secondly, the noise is measured with the signal present from 1 MHz to second harmonic of the signal. The final fundamental frequency 400 is nearly a constant frequency and is approximately sinusoidal with the fundamental at a few hundred MHz. The spectral content of interest contains only one peak at the fundamental and the remaining is noise. It can be shown that the effect of the image frequency 405 to the signal measurement is a slight increase in noise by a factor of 1.414. Since the signal is much larger it does not significantly change the result. This could be compensated in the processing of the energy content signal 250 by the tester process controller 235. The noise measurement is effected similarly by an increase of 1.414 times, because the noise floor 425 is nearly constant within the 2 MHz separation of the image frequency 405 and the final fundamental frequency 400.

As noted above, the spectrum analyzer 220 of the magnetic head/media tester of this invention is a relatively simple structure. The nonlinearity of the logarithmic amplifier 330 must be compensated. The noise bandwidth of the first bandpass filter 310 and the second bandpass filter 325 determined to establish the spectrum frequency flatness of the first bandpass filter 310 and the second bandpass filter 325. To perform the calculations for adjusting the digital energy content signal 250, the tester process controller 235 set the calibrate/operate select signal line 265 to the calibrate mode. The calibration/operation switch 260 is set to the calibrate mode to allow the calibration frequency signal $f_{CAL}$ 270 to be transferred to the spectrum analyzer 220.

To determine the linearity of the logarithmic amplifier 330, the tester process controller 235 sets the calibration frequency signal $f_{CAL}$ 270 to single sinusoidal frequency and with a known amplitude. The calibration frequency signal $f_{CAL}$ 270 is then swept over a range of amplitudes. The tester process controller 235 receives the digital energy content signal 250 and from the known amplitude of the calibration frequency signal $f_{CAL}$ 270 determines a logarithmic linearity factor of the logarithmic amplifier 330. The tester process controller 235 applies the logarithmic linearity factor to the digital energy content signal 250 to correct for the nonlinearity.

To determine the flatness of the frequency response of the first bandpass filter 310 and the second bandpass filter 325, the tester process controller 235 sets the calibration frequency signal $f_{CAL}$ 270 to single sinusoidal frequency and with a known amplitude. The calibration frequency signal $f_{CAL}$ 270 is then swept over a range of frequencies. The tester process controller 235 receives the digital energy content signal 250 and from the known amplitude of the calibration frequency signal $f_{CAL}$ 270 determines a frequency flatness factor of the first bandpass filter 310 and the second bandpass filter 325. The tester process controller 235 applies the frequency flatness factor to the digital energy content signal 250 to correct for any distortion of the first bandpass filter 310 and the second bandpass filter 325.

To calibrate the noise bandwidth of the second bandpass filter 325, the tester process controller 235 sets the calibration frequency signal $f_{CAL}$ 270 to single sinusoidal frequency and with a known amplitude and injects a white noise source with a known RMS (root mean square) amplitude of the white noise. The calibration frequency signal $f_{CAL}$ 270 is then swept over a range of frequencies. The tester process controller 235 receives the digital energy content signal 250 and from the known frequencies of the calibration frequency signal $f_{CAL}$ 270 determines a noise bandwidth factor of the second bandpass filter 325. The tester process controller 235 applies the noise bandwidth factor to the digital energy content signal 250 to correct for the nonlinearity of the noise bandwidth of the second bandpass filter 325.

An overwrite noise test determines the amount of noise present on the magnetic head 205 or magnetic media 210 when magnetic head 205 or magnetic media 210 are written and then overwritten. The remaining magnetic signal on the magnetic head 205 or magnetic media 210 is a latent noise level for the currently written signal. Typically, the basic writing rate magnetic head 205 or magnetic media 210 is approximately 300 Mbps (Megabits/sec.). Thus a base writing time (T) is 3.3 nsec. For the overwrite test, the original data is written through the Read Receiver/Write Driver circuit 215 for 6T or 10.8 nsec. The sequential data is then written by the Read Receiver/Write Driver circuit 215 for 2T or 6.6 nsec. The overwrite noise is then determined as the signal-to-noise ratio as determined for the basic signal-to-noise ratio described above, except the noise is now indicative of the amount of residual signal remaining on the magnetic head/media component.

Figure 7:
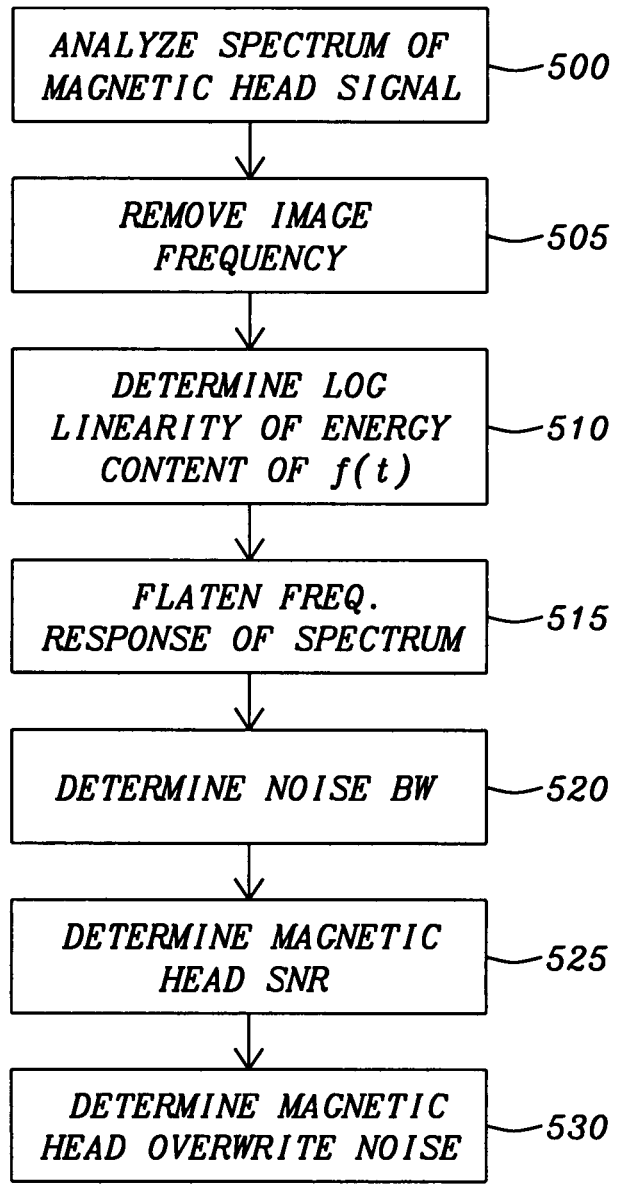
FIG. 7 is a flow chart of the method for characterizing electronic components such as magnetic head/media components of this invention.
Figure 8:
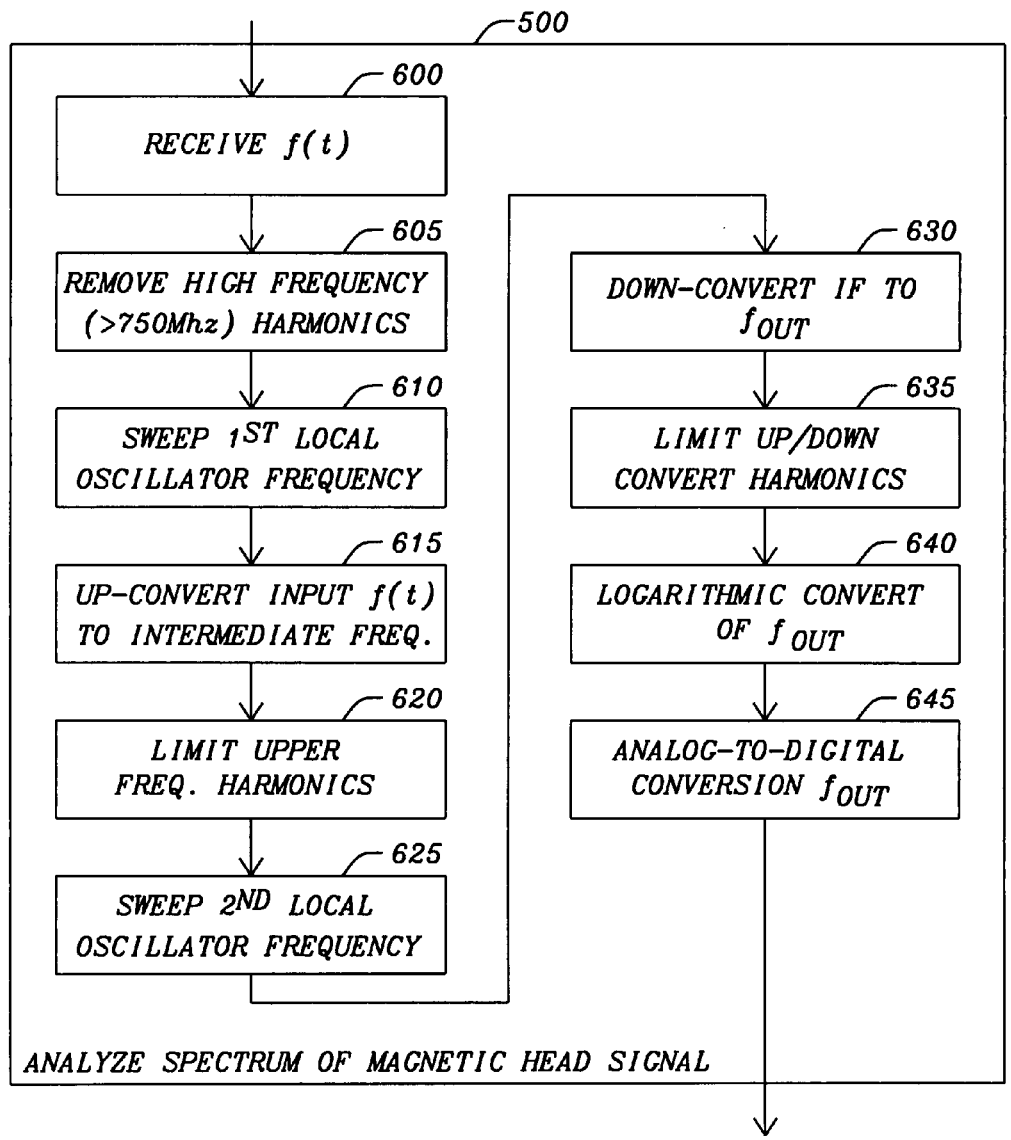
FIG. 8 is a flow chart for analyzing the spectrum of a response characterization signal for characterizing electronic components such as magnetic head/media components of this invention.

Referring now to FIG. 7 for a discussion of a method for testing electronic components such as magnetic head/media components. A response characterization signal f(t) is analyzed (Box 500) to determine the frequency content of the response characterization signal f(t) 217. Referring to FIG. 8 for a discussion of the analyzing (Box 500) of the response characterization signal f(t), the response characterization signal f(t) is received (Box 600) and low pass filtered (Box 605) to remove the high frequency harmonics. In the case of head/media components the high frequency harmonics are greater than 750 MHz. A first local oscillator frequency is swept (Box 610) and then combined with the response characterization signal f(t) to up-convert (Box 615) to an intermediate frequency signal. The intermediate frequency signal is then filtered to limit (Box 620) any of the upper harmonics. A second local oscillator is swept (Box 625) and combined with the intermediate frequency signal to down convert (Box 630) the intermediate frequency to the final fundamental frequency.

The final fundamental frequency is then filtered to limit (Box 635) the frequencies introduced in the up-conversion and the down-conversion. The filtered final fundamental frequency is then logarithmic amplified (Box 640) to convert the dynamic range of the response characterization signal f(t) to decibels to determine the energy content of the response characterization signal f(t).

As described above the image frequency, it can be shown that the effect of the image frequency to the signal measurement is a slight increase in noise by a factor of 1.414. Since the signal is much larger this does not significantly change the result. The image frequency is then compensated (Box 505) in the processing of the energy content response characterization signal f(t). The noise measurement is effected similarly by an increase of 1.414 times, because the noise floor is nearly constant within the 2 MHz separation of the image frequency and the final fundamental frequency.

In the logarithmic amplifying (Box 640) to convert the dynamic range of the response characterization signal f(t) to decibels to determine the energy content of the response characterization signal f(t), the physical circuitry to accomplish this may introduce nonlinearities to the energy content of the response characterization signal f(t). These nonlinearities of the logarithmic amplified filtered final fundamental frequency must be determined (Box 510). To accomplish this, a calibration frequency signal $f_{CAL}$ is set to single sinusoidal frequency and with a known amplitude. The calibration frequency signal $f_{CAL}$ 270 is then swept over a range of amplitudes. The energy content of the known amplitude of the calibration frequency signal $f_{CAL}$ 270 determines a logarithmic linearity factor. The logarithmic linearity factor is applied to the energy content to correct for the nonlinearity.

In the limiting (Box 620) of the upper harmonics and the limiting (Box 625) of the frequencies introduced in the up-conversion and the down-conversion, the physical circuitry to accomplish this may introduce nonlinearities in the frequency response. To determine the flatness of the frequency response, a the calibration frequency signal $f_{CAL}$ is set to single sinusoidal frequency and with a known amplitude. The calibration frequency signal is then swept over a range of frequencies. The digital energy content is compared with the known amplitude of the calibration frequency signal $f_{CAL}$ to determine (Box 515) a frequency flatness factor of the limiting (Box 620) of the upper harmonics and the limiting (Box 625) of the frequencies introduced in the up-conversion and the down-conversion. The frequency flatness factor is applied to the limiting (Box 620) of the upper harmonics and the limiting (Box 625) of the frequencies introduced in the up-conversion and the down-conversion to compensate for the nonlinearities.

In the limiting (Box 620) of the upper harmonics and the limiting (Box 625) of the frequencies introduced in the up-conversion and the down-conversion, the physical circuitry to accomplish this may introduce noise in the frequency response. The noise bandwidth must be determined (Box 520) for determining the signal-to-noise ratio of the magnetic head/media component. To calibrate the noise bandwidth, the calibration frequency signal $f_{CAL}$ is set to single sinusoidal frequency and with a known amplitude and injects a white noise source with a known RMS (root mean square) amplitude of the white noise. The calibration frequency signal $f_{CAL}$ is then swept over a range of frequencies. The energy content signal and from the known frequencies of the calibration frequency signal $f_{CAL}$ determines a noise bandwidth factor. The noise bandwidth factor is applied to the energy content to correct for the nonlinearity of the noise bandwidth.

A signal-to-noise ratio test determines analyzed (Box 525) the ratio of the relative noise to the response characterization signal f(t). The signal-to-noise ratio test requires two types of measurements. First, the final fundamental frequency is measured at its fundamental frequency. Secondly, the noise bandwidth is determined analyzed (Box 520) with the signal present from 1 MHz to second harmonic of the final fundamental frequency. The final fundamental frequency is nearly a constant frequency and is approximately sinusoidal with the fundamental at a few hundred MHz. The spectral content of interest contains only one peak at the fundamental and the remaining is noise. It can be shown that the effect of the image frequency to the signal measurement is a slight increase in noise by a factor of 1.414. Since the signal is much larger it does not significantly change the result. This could be compensated in the processing of the energy content. The noise measurement is effected similarly by an increase of 1.414 times, because the noise floor is nearly constant within the 2 MHz separation of the image frequency and the final fundamental frequency.

An overwrite noise test determines the amount of noise present on a magnetic head/media component when a magnetic head/media component is written and then overwritten. The remaining magnetic signal on the magnetic head/media component is a latent noise level for the currently written signal. Typically, the basic writing rate for a magnetic head/media component is approximately 300 Mbps (Megabits/sec.). Thus a base writing time (T) is 3.3 nsec. For the overwrite test, the original data is written for 6T or 10.8 nsec. The sequential data is then written for 2T or 6.6 nsec. The overwrite noise is then determined (Box 530) as the signal-to-noise ratio as determined (Box 525) for the basic signal-to-noise ratio, except the noise is now indicative of the amount of residual signal remaining on the magnetic head/media component.

Figure 2:
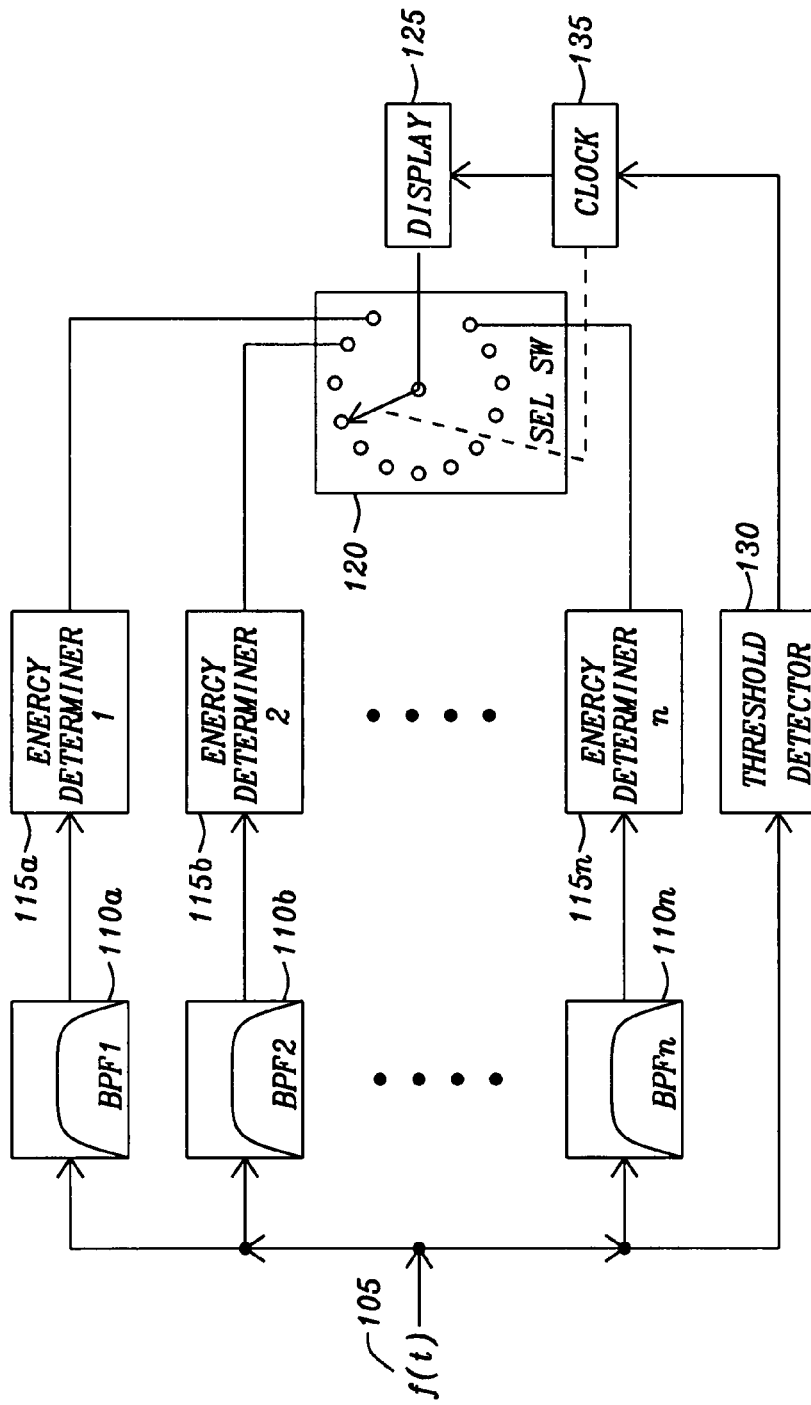
FIG. 2 is a schematic diagram of a multi-channel spectrum analyzer of the prior art.

It should be noted that the structure as described for the spectrum analyzer of the magnetic head/media tester of this invention is a superheterodyne spectrum analyzer. It would be apparent to one skilled in the art that the multi-channel spectrum analyzer of FIG. 2 could be adapted for the spectrum analyzer of a magnetic head/media tester and still be in keeping with this invention.

While this invention has been particularly shown and described with reference to the preferred embodiments thereof, it will be understood by those skilled in the art that various changes in form and details may be made without departing from the spirit and scope of the invention.

The invention claimed is:

1. An electronic component tester for characterizing electronic components comprising:
    means for exciting a response characterization signal from said electronic components for determining a residual signal remaining in said electronic components from said means for exciting the response characterization signal in a first period of time impacting said response characterization signal from a second period of time;
    a spectrum analyzer in communication with said electronic components to receive said response characterization signal for determining a frequency spectrum of said response characterization signal, the spectrum analyzer comprising:
        an up-converter circuit receiving a low pass filtered response characterization signal for conversion to an intermediate frequency signal,
        a first bandpass filter in communication with the up-converter circuit to receive said intermediate frequency signal for filtering to further limit harmonic frequencies; and
        a second bandpass filter connected to receive a final output frequency signal for filtering to further limit said harmonic frequencies;
        wherein a center frequency of said first bandpass filter is a sum of the intermediate frequency and a center frequency of said second bandpass filter; and
    a tester process controller in communication with the spectrum analyzer for generating calibration and control signals for removing effects of an image frequency of said characterization signal from the first period of time from said response characterization signal from the second period of time and for determining a signal-to-noise ratio for determining said residual signal.

2. The electronic component tester of claim 1 wherein said electronic components are magnetic head/media components.

3. The electronic component tester of claim 1 wherein said spectrum analyzer is selected from the group of spectrum analysis devices consisting of a superheterodyne spectrum analyzer and a multiple channel spectrum analyzer.

4. The electronic component tester of claim 1 wherein the up-converter circuit is in communication with said low pass filter to receive the low pass filtered response characterization signal for conversion to the intermediate frequency signal and in communication with said tester process controller to receive a first sweeping signal of said calibration and control signals to adjust said up-converter circuit such that said intermediate frequency signal is swept over a range of frequencies from a lower bandwidth frequency and said upper bandwidth frequency and wherein said spectrum analyzer comprises:
  a down converter circuit in communication with said first bandpass filter receive a bandpass filtered intermediate frequency signal for conversion of said bandpass filtered intermediate frequency to a final output frequency signal and in communication with said tester process controller to receive a second sweeping signal of said calibration and control signals to adjust said down-converter circuit such that said final output frequency signal is swept over a range of frequencies from a lower bandwidth frequency and said upper bandwidth frequency; and
  an energy determination circuit in communication with said down converter circuit to receive said final output frequency signal for generating an energy content signal indicating an energy content of said final output frequency.

5. The electronic component tester of claim 4 wherein said spectrum analyzer further comprises an analog-to-digital converter in communication with said energy determination circuit to receive said energy content signal for conversion of said energy content signal to a digital energy content signal and in communication with said tester process controller for transferring said digital energy content signal to said tester process controller, wherein said tester process controller evaluates said energy content signal to create said frequency spectrum for characterizing said electronic components.

6. The electronic component tester of claim 4 wherein said up converter comprises:
  a first phase-locked loop to generate a first local oscillator signal; and
  a first frequency mixer connected to receive said low pass filtered response characterization signal and in communication with said phase-locked loop for receiving said first local oscillator signal, wherein said low pass filtered response characterization signal and said first local oscillator signal are combined to form said intermediate frequency.

7. The electronic component tester of claim 6 wherein a lowest frequency of said first local oscillator signal is greater than a maximum frequency of said response characterization signal and said intermediate frequency.

8. The electronic component tester of claim 6 wherein said local oscillator signal is determined by the equation:

$$f_{LO}=f_{IF}+f_{IN}$$

where:
  $f_{LO}$ is the local oscillator signal frequency,
  $f_{IF}$ is the intermediate frequency,
  $f_{IN}$ is an input frequency of the response characterization signal.

9. The electronic component tester of claim 4 wherein a center frequency of said first bandpass filter determined by the equation:

$$f_{BPF1}=K \times f_{IN\_MAX}$$

where:
  K is a constant of between 1.3 and 1.5,
  $f_{IN\_MAX}$ is a maximum frequency of response characterization signal.

10. The electronic component tester of claim 4 wherein said down converter circuit comprises:
  a second phase-locked loop to generate a second local oscillator signal; and
  a second frequency mixer connected to receive said bandpass filtered intermediate frequency signal and in communication with said second phase-locked loop for receiving said second local oscillator signal, wherein said bandpass filtered intermediate frequency signal and said second local oscillator signal are combined to form said final output frequency signal.

11. The electronic component tester of claim 4 wherein said spectrum analyzer comprises a reference oscillator in communication with said up-converter circuit and said down-converter circuit to provide a stable reference frequency signal for said up-converter circuit and said down-converter circuit.

12. The electronic component tester of claim 5 wherein said tester process controller injects a first calibration stimulus signal into said spectrum analyzer and receives said digital energy content signal, said calibration stimulus signal being swept through a range of amplitude to calibrate a logarithmic linearity factor of said spectrum analyzer.

13. The electronic component tester of claim 5 wherein said tester process controller injects said calibration stimulus signal into said spectrum analyzer and receives said digital energy content signal, a second calibration stimulus signal being swept through a range of frequencies to calibrate a frequency flatness factor of said spectrum analyzer.

14. The electronic component tester of claim 13 wherein said frequency flatness factor is applied to said digital energy content signal to flatten frequency response of said digital energy content signal.

15. The electronic component tester of claim 5 wherein said tester process controller injects said calibration stimulus signal and a white noise signal of known amplitude into said spectrum analyzer and receives said digital energy content signal, a third calibration stimulus signal being swept through a range of frequencies to calibrate a noise bandwidth factor for said spectrum analyzer.

16. The electronic component tester of claim 1 wherein the means for exciting a response characterization signal from said electronic components is activated for a first period of time and then activated for a second period of time, said spectrum of said response characteristic signal from said second period of time being determined and from said spectrum of said response characteristic signal, the signal-to-noise ratio is analyzed to determine said residual signal from said first period of time impacting said response characterization signal from said second period of time.

17. A spectrum analyzer for characterizing frequency response of electronic components wherein:
  said spectrum analyzer is in communication with said electronic components to receive a response characterization signal for determining a frequency spectrum of said response characterization signal and is in communication with an electronic component tester process controller for transferring said frequency spectrum to said electronic component tester process controller and to receive calibration and control signals for removing effects of an image frequency of the characterization signal at a first time from the characterization signal at a second time and determine a signal-to-noise ratio for determining the residual signal from the response characterization signal at the first time that impacts the response characterization signal excited at the second time from said electronic components; said spectrum analyzer comprising:

an up-converter circuit receiving a low pass filtered response characterization signal for conversion to an intermediate frequency signal and in communication with said electronic component tester process controller to receive a first sweeping signal of said calibration and control signals to adjust said up-converter circuit such that said intermediate frequency signal is swept over a range of frequencies from a lower bandwidth frequency and said upper bandwidth frequency;

a first bandpass filter in communication with the up-converter circuit to receive the intermediate frequency signal for filtering to further limit harmonic frequencies; and a second bandpass filter connected to receive a final output frequency signal for filtering to further limit said harmonic frequencies; and wherein a center frequency of said first bandpass filter is a sum of the intermediate frequency and a center frequency of said second bandpass filter.

18. The spectrum analyzer of claim 17 wherein said electronic components are magnetic head/media components.

19. The spectrum analyzer of claim 17 wherein said spectrum analyzer is selected from the group of spectrum analysis devices consisting of a superheterodyne spectrum analyzer and a multiple channel spectrum analyzer.

20. The spectrum analyzer of claim 17 further comprising:
a low pass filter connected to receive said response characterization signal for filtering harmonic frequencies above an upper bandwidth frequency;
a down converter circuit in communication with said first bandpass filter receive a bandpass filtered intermediate frequency signal for conversion of said bandpass filtered intermediate frequency to a final output frequency signal and in communication with said electronic component tester process controller to receive a second sweeping signal of said calibration and control signals to adjust said down-converter circuit such that said final output frequency signal is swept over a range of frequencies from a lower bandwidth frequency and said upper bandwidth frequency; and
an energy determination circuit in communication with said down converter circuit to receive said final output frequency signal for generating an energy content signal indicating an energy content of said final output frequency.

21. The spectrum analyzer of claim 17 further comprising an analog-to-digital converter in communication with said energy determination circuit to receive said energy content signal for conversion of said energy content signal to a digital energy content signal and in communication with said electronic component tester process controller for transferring said digital energy content signal to said electronic component tester process controller, wherein said electronic component tester process controller evaluates said energy content signal to create said frequency spectrum for characterizing said electronic components.

22. The spectrum analyzer of claim 20 wherein said up converter comprises:
a first phase-locked loop to generate a first local oscillator signal; and
a first frequency mixer connected to receive said receive said low pass filtered response characterization signal and in communication with said phase-locked loop for receiving said first local oscillator signal, wherein said low pass filtered response characterization signal and said first local oscillator signal are combined to form said intermediate frequency.

23. The spectrum analyzer of claim 22 wherein a lowest frequency of said first local oscillator signal is greater than a maximum frequency of said response characterization signal and said intermediate frequency.

24. The spectrum analyzer of claim 22 wherein a said local oscillator signal is determined by the equation:

$$f_{LO}=f_{IF}+f_{IN}$$

where:
$f_{LO}$ is the local oscillator signal frequency,
$f_{IF}$ is the intermediate frequency,
$f_{IN}$ is an input frequency of the response characterization signal.

25. The spectrum analyzer of claim 20 wherein a center frequency of said first bandpass filter determined by the equation:

$$f_{BPF1}=K \times f_{IN\_MAX}$$

where:
K is a constant of between 1.3 and 1.5,
$f_{IN\_MAX}$ is a maximum frequency of response characterization signal.

26. The spectrum analyzer of claim 20 wherein said down converter circuit comprises:
a second phase-locked loop to generate a second local oscillator signal; and
a second frequency mixer connected to receive said bandpass filtered intermediate frequency signal and in communication with said phase-locked loop for receiving said second local oscillator, wherein said bandpass filtered intermediate frequency signal and said second local oscillator signal are combined to form said final output frequency signal.

27. The spectrum analyzer of claim 20 further comprising a reference oscillator in communication with said up-converter circuit and said down-converter circuit to provide a stable reference frequency signal for said up-converter circuit and said down-converter circuit.

28. The spectrum analyzer of claim 21 wherein said electronic component tester process controller injects a calibration stimulus signal into said spectrum analyzer and receives said digital energy content signal, said calibration stimulus signal being swept through a range of amplitude to calibrate a logarithmic linearity factor of said spectrum analyzer.

29. The spectrum analyzer of claim 21 wherein said electronic component tester process controller injects said calibration stimulus signal into said spectrum analyzer and receives said digital energy content signal, said calibration stimulus signal being swept through a range of frequencies to calibrate a frequency flatness factor of said spectrum analyzer.

30. The spectrum analyzer of claim 29 wherein said frequency flatness factor is applied to said digital energy content signal to flatten frequency response of said digital energy content signal.

31. The spectrum analyzer of claim 21 wherein said electronic component tester process controller injects said calibration stimulus signal and a white noise signal of known amplitude into said spectrum analyzer and receives said digital energy content signal, said calibration stimulus signal being swept through a range of frequency to calibrate a noise bandwidth factor for said spectrum analyzer.

32. The spectrum analyzer of claim 21 wherein the means for exciting a response characterization signal from said electronic components said electronic components is activated for said first period of time and then activated for said second period of time, said spectrum of said response characteristic signal from said second period of time being determined and from said spectrum of said response characteristic signal, the signal-to-noise ratio is analyzed to determine said residual signal from said first period of time impacting said response characterization signal from said second period of time.

33. A method for characterizing electronic components comprising the steps of:
  exciting a first response characterization signal from said electronic components for a first period of time;
  exciting the second response characterization signals from said electronic components for a second period of time;
  determining a residual signal from said first characterization signal applied to said electronic components for said first period of time impacting said second response characterization signal from said second period of time;
  generating calibration and control signals for removing the residual signal of the first response characterization signal from said second response characterization signal; and
  analyzing a frequency spectrum of the first characterization signal from a stimulation of said electronic components, said analyzing comprising the steps of:
    receiving said first response characterization signal,
    determining a frequency spectrum of said first response characterization signal,
    receiving said second response characterization signal,
    determining a frequency spectrum of said second response characterization signal,
    low pass filtering said response characterization signal to remove harmonic frequencies above an upper bandwidth frequency,
    up-converting a low pass filtered response characterization signal to an intermediate frequency signal, said up-converting comprising the step of sweeping said intermediate frequency signal over a range of frequencies from a lower bandwidth frequency and said upper bandwidth frequency,
    bandpass filtering the intermediate frequency signal to further limit said harmonic frequencies, wherein a center frequency of said first bandpass filtering is a function of a maximum frequency of the response characterization signal;
    bandpass filtering a final output frequency signal to further limit said harmonic frequencies, wherein said bandpass filtering of the intermediate frequency signal has a center frequency that is a sum of the intermediate frequency and a center frequency of said bandpass filtering of the final output frequency signal; and
    removing effects of an image frequency of said frequency spectrum of the first response characterization signal from said second response characterization signal and determining a signal-to-noise ratio for determining said residual signal.

34. The method of claim 33 wherein determining a frequency spectrum of said response characterization signal is performed by a spectrum analyzer, said spectrum analyzer is selected from the group of spectrum analysis devices consisting of a superheterodyne spectrum analyzer and a multiple channel spectrum analyzer.

35. The method of claim 33 wherein analyzing said frequency spectrum comprises:
  down-converting a bandpass filtered intermediate frequency signal to the final output frequency signal, said down-converting comprising sweeping said final output frequency signal over a range of frequencies from a lower bandwidth frequency and said upper bandwidth frequency; and
  generating an energy content signal indicating an energy content of said final output frequency.

36. The method of claim 35 further comprising the steps of:
  analog-to-digital converting said energy content signal to a digital energy content signal; and
  transferring said digital energy content signal for evaluation said energy content signal to create said frequency spectrum for characterizing said electronic components.

37. The method of claim 35 wherein up-converting said low pass filtered response characterization signal comprises the steps of:
  generating a first local oscillator signal; and
  mixing said low pass filtered response characterization signal and said first local oscillator signal to form said intermediate frequency.

38. The method of claim 37 wherein a lowest frequency of said first local oscillator signal is greater than a maximum frequency of said response characterization signal and said intermediate frequency.

39. The method of claim 37 wherein a said local oscillator signal is determined by the equation:

$$f_{LO} = f_{IF} + f_{IN}$$

where:
  $f_{LO}$ is the local oscillator signal frequency,
  $f_{IF}$ is the intermediate frequency,
  $f_{IN}$ is an input frequency of the response characterization signal.

40. The method of claim 35 wherein a center frequency of said first bandpass filter determined by the equation:

$$f_{BPF1} = K \times f_{IN\_MAX}$$

where:
  K is a constant of between 1.3 and 1.5,
  $f_{IN\_MAX}$ is a maximum frequency of response characterization signal.

41. The method of claim 35 wherein down-converting a bandpass filtered intermediate frequency signal comprises the steps of:
  generating a second local oscillator signal; and
  mixing said bandpass filtered intermediate frequency signal and said second local oscillator signal to form said final output frequency signal.

42. The method of claim 35 further comprises the step of providing a stable reference frequency signal for said up-converting and said down-converting.

43. The method of claim 33 further comprising the steps of:
  sweeping a calibration stimulus signal through a range of amplitude to calibrate a logarithmic linearity factor.

44. The method of claim 36 further comprising the step of sweeping a first calibration stimulus signal through a range of frequencies to calibrate a frequency flatness factor.

45. The method of claim 44 further comprising the step of applying said frequency flatness factor to said digital energy content signal to flatten frequency response of said digital energy content signal.

46. The method of claim 33 further comprising the steps of determining a noise bandwidth factor as a combination of a second calibration stimulus signal and a white noise signal of known amplitude.

47. The method of claim 33 further comprising the steps of:
determining said spectrum of said response characteristic signal from said second period of time;
analyzing said spectrum of said response characteristic signal from said second period of time to determine said signal-to-noise ratio; and
analyzing said signal-to-noise ratio to determine said residual signal from said response characterization signal for said first period of time impacting said response characterization signal from said second period of time.

48. A magnetic head/media component tester for characterizing magnetic head/media components comprising:
means for exciting a response characterization signal from magnetic head/media components for determining a residual signal remaining in said magnetic head/media components for a first period of time impacting said responses characterization signal from a second period of time;
a spectrum analyzer in communication with said electronic components to receive said first and second response characterization signals for determining frequency spectrums of said first and second response characterization signals, said spectrum analyzer comprising:
a low pass filter connected to receive said response characterization signal for filtering harmonic frequencies above an upper bandwidth frequency;
an up-converter circuit in communication with said low pass filter to receive a low pass filtered response characterization signal for conversion to an intermediate frequency signal and in communication with said tester process controller to receive a first sweeping signal of said calibration and control signals to adjust said up-converter circuit such that said intermediate frequency signal is swept over a range of frequencies from a lower bandwidth frequency and said upper bandwidth frequency;
a first bandpass filter in communication with the up-converter circuit to receive the intermediate frequency signal for filtering to limit harmonic frequencies from said first and second response characterization signals, wherein a center frequency of said first bandpass filter is a function of a maximum frequency of the response characterization signals,
a second bandpass filter connected to receive a final output frequency signal for filtering to further limit said harmonic frequencies,
wherein a center frequency of said first bandpass filter is a sum of the intermediate frequency and a center frequency of said second bandpass filter; and
a tester process controller in communication with the spectrum analyzer for generating calibration and control signals for removing effects of an image frequency of said response characterization signal from the first period of time from said response characterization signal from the second period of time and for determining a signal-to-noise ratio for determining said residual signal.

49. The magnetic head/media component tester of claim 48 wherein said spectrum analyzer further comprises:
a down converter circuit in communication with said first bandpass filter receive a bandpass filtered intermediate frequency signal for conversion of said bandpass filtered intermediate frequency to the final output frequency signal and in communication with said tester process controller to receive a second sweeping signal of said calibration and control signals to adjust said down-converter circuit such that said final output frequency signal is swept over a range of frequencies from a lower bandwidth frequency and said upper bandwidth frequency; and
an energy determination circuit in communication with said down converter circuit to receive said final output frequency signal for generating an energy content signal indicating an energy content of said final output frequency.

50. The magnetic head/media component tester of claim 49 wherein said spectrum analyzer is selected from the group of spectrum analysis devices consisting of a superheterodyne spectrum analyzer and a multiple channel spectrum analyzer.

51. The magnetic head/media component tester of claim 50 wherein said spectrum analyzer further comprises an analog-to-digital converter in communication with said energy determination circuit to receive said energy content signal for conversion of said energy content signal to a digital energy content signal and in communication with said tester process controller for transferring said digital energy content signal to said tester process controller, wherein said tester process controller evaluates said energy content signal to create said frequency spectrum for characterizing said magnetic head/media components.

52. The magnetic head/media component tester of claim 50 wherein said up converter comprises:
a first phase-locked loop to generate a first local oscillator signal; and
a first frequency mixer connected to receive said receive said low pass filtered response characterization signal and in communication with said phase-locked loop for receiving said first local oscillator signal, wherein said low pass filtered response characterization signal and said first local oscillator signal are combined to form said intermediate frequency.

53. The magnetic head/media component tester of claim 52 wherein a lowest frequency of said first local oscillator signal is greater than a maximum frequency of said response characterization signal and said intermediate frequency.

54. The magnetic head/media component tester of claim 52 wherein a said local oscillator signal is determined by the equation:

$$f_{LO}=f_{IF}+f_{IN}$$

where:
$f_{LO}$ is the local oscillator signal frequency,
$f_{IF}$ is the intermediate frequency,
$f_{IN}$ is an input frequency of the response characterization signal.

55. The magnetic head/media component tester of claim 50 wherein a center frequency of said first bandpass filter determined by the equation:

$$f_{BPF1}=K \times f_{IN\_MAX}$$

where:
K is a constant of between 1.3 and 1.5,
$f_{IN\_MAX}$ is a maximum frequency of response characterization signal.

56. The magnetic head/media component tester of claim 50 wherein said down converter circuit comprises:
- a second phase-locked loop to generate a second local oscillator signal; and
- a second frequency mixer connected to receive said bandpass filtered intermediate frequency signal and in communication with said phase-locked loop for receiving said second local oscillator, wherein said bandpass filtered intermediate frequency signal and said second local oscillator signal are combined to form said final output frequency signal.

57. The magnetic head/media component tester of claim 48 wherein said spectrum analyzer comprises a reference oscillator in communication with said up-converter circuit and said down-converter circuit to provide a stable reference frequency signal for said up-converter circuit and said down-converter circuit.

58. The magnetic head/media component tester of claim 51 wherein said tester process controller injects a calibration stimulus signal into said spectrum analyzer and receives said digital energy content signal, said calibration stimulus signal being swept through a range of amplitude to calibrate a logarithmic linearity factor of said spectrum analyzer.

59. The magnetic head/media component tester of claim 51 wherein said tester process controller injects said calibration stimulus signal into said spectrum analyzer and receives said digital energy content signal, said calibration stimulus signal being swept through a range of frequencies to calibrate a frequency flatness factor of said spectrum analyzer.

60. The magnetic head/media component tester of claim 59 wherein said frequency flatness factor is applied to said digital energy content signal to flatten frequency response of said digital energy content signal.

61. The magnetic head/media component tester of claim 51 wherein said tester process controller injects said calibration stimulus signal and a white noise signal of known amplitude into said spectrum analyzer and receives said digital energy content signal, said calibration stimulus signal being swept through a range of frequency to calibrate a noise bandwidth factor for said spectrum analyzer.

62. The magnetic head/media component tester of claim 51 wherein the means for exciting a response characterization signal from said magnetic head/media components is activated for said first period of time and then activated for said second period of time, said spectrum of said response characterization signal from said second period of time being determined and from said spectrum of said response characteristic signal, the signal-to-noise ratio is analyzed to determine a residual signal from said first period of time impacting said response characterization signal from said second period of time.

* * * * *